(12) United States Patent
Sakamoto et al.

(10) Patent No.: US 9,466,817 B2
(45) Date of Patent: Oct. 11, 2016

(54) METHOD OF MANUFACTURING A DISPLAY DEVICE

(71) Applicant: Japan Display Inc., Tokyo (JP)

(72) Inventors: Hirotsugu Sakamoto, Tokyo (JP); Masakazu Gunji, Tokyo (JP)

(73) Assignee: Japan Display Inc., Tokyo (JP)

( * ) Notice: Subject to any disclaimer, the term of this patent is extended or adjusted under 35 U.S.C. 154(b) by 3 days.

(21) Appl. No.: 14/717,786

(22) Filed: May 20, 2015

(65) Prior Publication Data

US 2015/0340661 A1 Nov. 26, 2015

(30) Foreign Application Priority Data

May 23, 2014 (JP) ................. 2014-106973

(51) Int. Cl.
*H01L 21/00* (2006.01)
*H01L 51/56* (2006.01)
*C03C 15/02* (2006.01)
*C03B 33/02* (2006.01)
*H01L 51/52* (2006.01)
*B28D 5/00* (2006.01)
*C03B 33/033* (2006.01)
*C03B 33/07* (2006.01)
*G02F 1/1333* (2006.01)

(52) U.S. Cl.
CPC ............ *H01L 51/56* (2013.01); *B28D 5/0011* (2013.01); *C03B 33/02* (2013.01); *C03B 33/033* (2013.01); *C03B 33/076* (2013.01); *C03C 15/02* (2013.01); *G02F 1/133351* (2013.01); *H01L 51/5246* (2013.01); *H01L 2251/566* (2013.01); *Y02P 40/57* (2015.11)

(58) Field of Classification Search
CPC ...................................... H01L 51/56
USPC ........................................ 438/28
See application file for complete search history.

(56) References Cited

U.S. PATENT DOCUMENTS

2009/0121337 A1* 5/2009 Abe .............. B23K 26/0057
257/686
2010/0091233 A1* 4/2010 Yamagishi ........... G02F 1/1339
349/153
2014/0045287 A1* 2/2014 Kira ................. G02F 1/133351
438/30
2015/0323829 A1* 11/2015 Huh ................. G02F 1/133351
445/25

FOREIGN PATENT DOCUMENTS

JP 2008-039866 A 2/2008
JP 2009-047875 A 3/2009
JP 2012-020902 A 2/2012

* cited by examiner

*Primary Examiner* — Matthew Landau
*Assistant Examiner* — Igwe U Anya
(74) *Attorney, Agent, or Firm* — Typha IP LLC

(57) ABSTRACT

A method of manufacturing a display device includes preparing a multilayout display panel which has a structure of a first substrate and a second substrate which are bonded to each other and is able to be cut into a plurality of products, scribing the first substrate, bending and breaking the scribed first substrate, performing thinning on the second substrate and the broken first substrate by chemical polishing, scribing the second substrate which is subjected to chemical polishing, and bending and breaking the scribed second substrate.

10 Claims, 21 Drawing Sheets

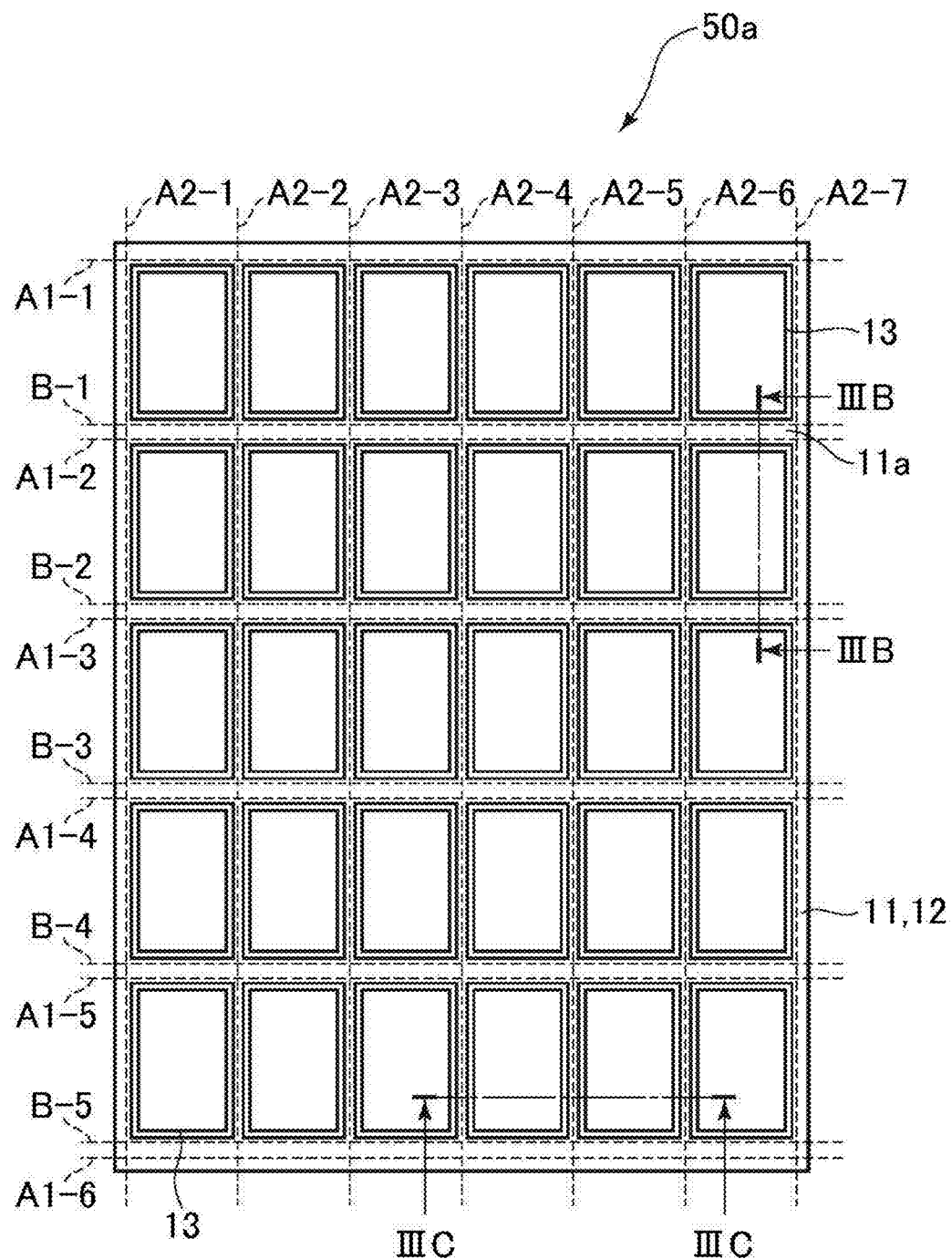

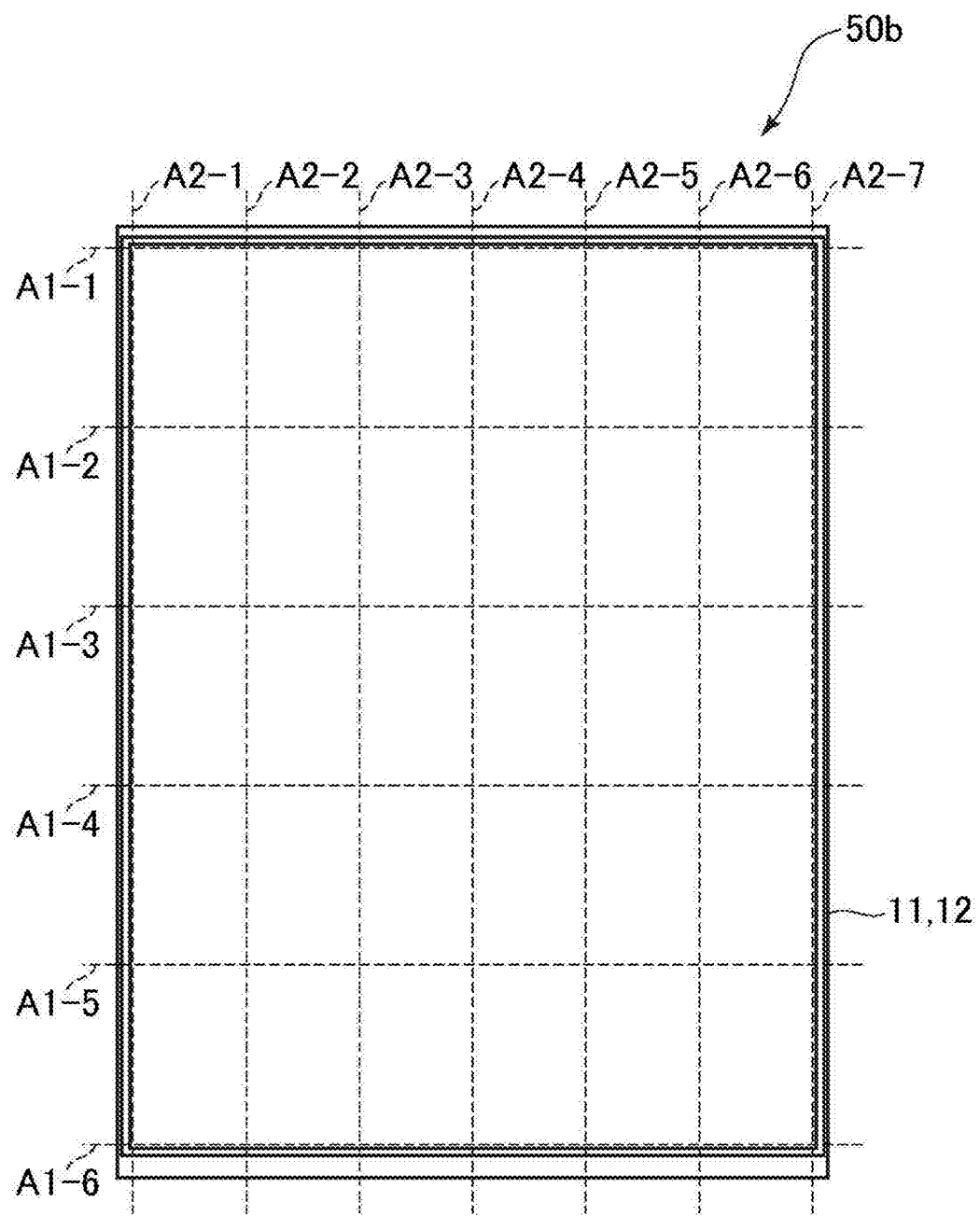

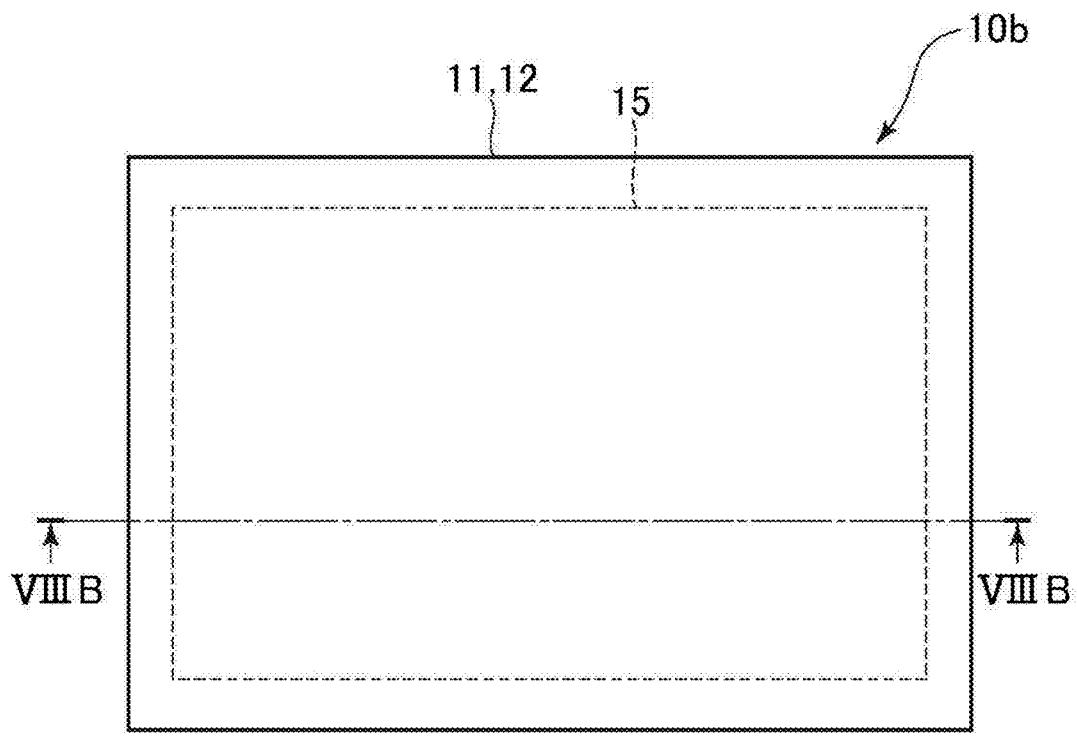

METHOD OF MANUFACTURING A DISPLAY DEVICE

CROSS-REFERENCE TO RELATED APPLICATION

The present application claims priority from Japanese patent application JP2014-106973 filed on May 23, 2014, the content of which is hereby incorporated by reference into this application.

BACKGROUND OF THE INVENTION

1. Field of the Invention

The present invention relates to a method of manufacturing a display device.

2. Description of the Related Art

Recently, in order to reduce the thickness and weight of a small or medium display, thinning of products is progressing. However, multiple production processing has been employed in order to improve productivity, and thus a thin film transistor substrate or a color filter substrate for manufacturing a multilayout panel has become larger. For this reason, it is difficult to reduce the thickness of the panel because the strength of a multilayout panel has to be maintained. Thus, in order to handle reduction in the thickness, the panel thickness of a multilayout panel is decreased through chemical polishing, and then the multilayout panel is cut into separate product panels by scribing and breaking the polished multilayout panel. JP 2008-39866A, JP 2009-47875A, and JP 2012-20902A disclose various scribing methods.

SUMMARY OF THE INVENTION

Conventionally, scribing and breaking processing is performed on each of both surfaces of a multilayout panel. The multilayout panel is configured by a pair of glass substrates which are bonded to each other. One glass substrate is broken and then the other glass substrate is broken. However, when a subsequent breaking processing is performed, the one glass substrate has been already broken due to earlier breaking processing. Accordingly, when the other glass substrate is bent in the subsequent breaking processing, if the one glass substrate which has been already broken is bent, there is a problem in that surfaces obtained by breaking may be brought into contact with each other and cracking may occur in a horizontal direction of a substrate surface.

An object of the present invention is to provide a method of manufacturing a display device which suppresses occurrence of cracking in a horizontal direction.

Other objects and new characteristics along with the above object of the present invention are clarified by descriptions in this specification and the accompanying drawings.

According to an embodiment of the present invention, a method of manufacturing a display device includes preparing a multilayout display panel to be divided into a plurality of products, the multilayout display panel having a structure of a first substrate and a second substrate being bonded to each other, scribing the first substrate, bending and breaking the scribed first substrate, performing thinning on the second substrate and the broken first substrate by chemical polishing, scribing the second substrate which is subjected to the chemical polishing, and bending and breaking the scribed second substrate.

In performing thinning on the second substrate and the broken first substrate by chemical polishing, facing surfaces of adjacent portions of the first substrate which are obtained by breaking the first substrate may be etched so as to cause a gap between the facing surfaces to become larger. In the breaking the second substrate, the first substrate may be bent by bending the second substrate while contact between at least end portions of the facing surfaces on an outer surface side of the first substrate is avoided.

The first substrate and the second substrate may be glass substrates. The multilayout display panel may have a seal portion between the first substrate and the second substrate, which is formed of sealant and is for sealing the plurality of products. The seal portion may surround a circumference of the entirety of the plurality of products.

The seal portion may seal each of the products. The seal portion may have a shared portion which is shared so as to seal products which are adjacent to each other. The seal portion may have portions which are disposed with a gap for sealing the adjacent products individually.

A position of the scribing line may be set to overlap the shared portion in at least one of scribing of the first substrate and scribing of the second substrate.

A position of the scribing line may be set to overlap an area corresponding to the gap in at least one of scribing of the first substrate and scribing of the second substrate.

A first scribing line may have a position which is set to overlap the area corresponding to the gap in scribing of the first substrate. A second scribing line and a third scribing line may have positions which are set to overlap the area corresponding to the gap in scribing of the second substrate, and the position of the second scribing line overlaps the first scribing line.

According to the embodiment of the present invention, there is provided a method of manufacturing a display device in which occurrence of cracking in a horizontal direction is suppressed.

BRIEF DESCRIPTION OF THE DRAWINGS

FIG. 3A is a plan view illustrating an example of a multilayout display panel prepared in the embodiment of the present invention.

FIG. 7 is a plan view illustrating an example of a multilayout display panel prepared in another embodiment of the present invention.

FIG. 8A is a plan view illustrating an example of a display device manufactured through another embodiment of the present invention.

DETAILED DESCRIPTION OF THE INVENTION

A method of manufacturing a display device according to an embodiment of the present invention may be applied to a method of manufacturing, for example, an organic light-emitting diode (OLED) display device, a liquid crystal display device, and the like. Hereinafter, descriptions will be made based on an example in which the method of manufacturing a display device according to the embodiment of the present invention is applied to a method of manufacturing an OLED display device.

Figure 1A:
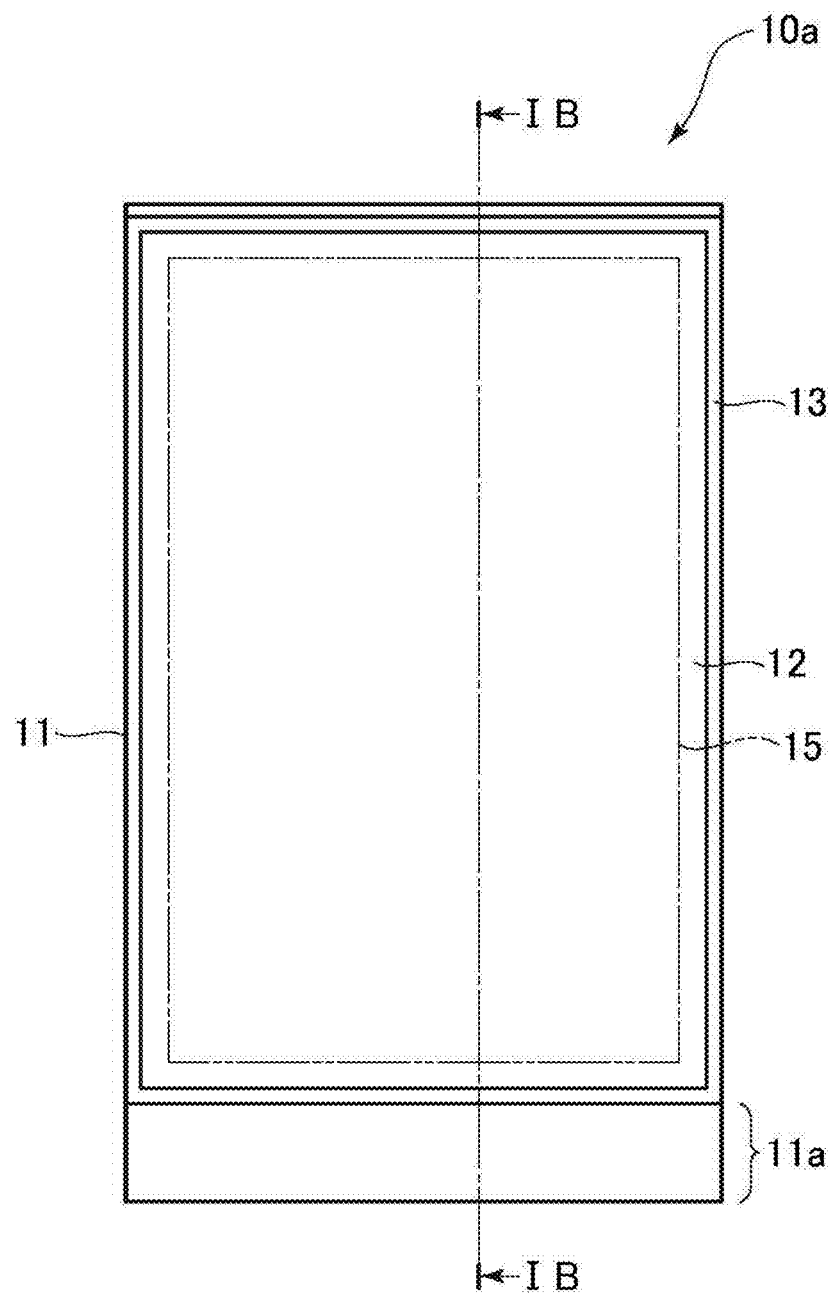
FIG. 1A is a plan view illustrating an example of a display device manufactured according to an embodiment of the present invention.
Figure 1B:
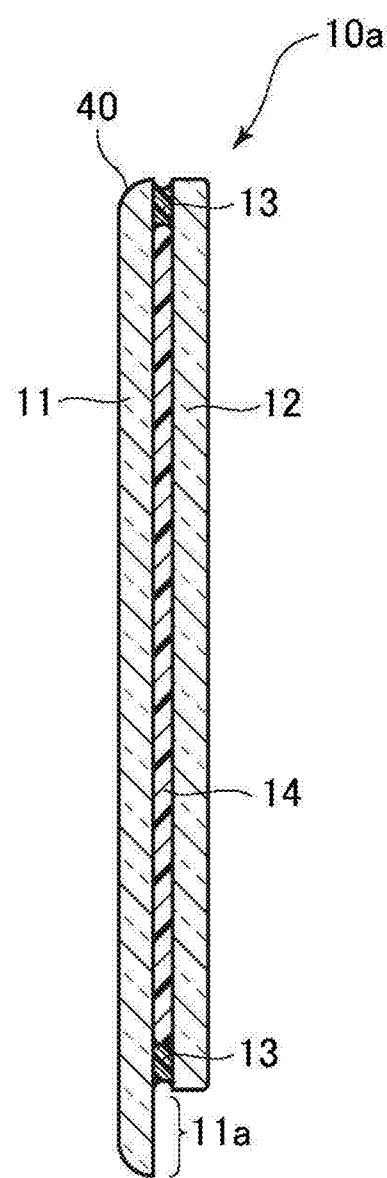
FIG. 1B is a view illustrating a cross-section taken along a cutting plane line IB-IB in FIG. 1A.

An OLED display device which is manufactured by the method of manufacturing a display device according to the embodiment of the present invention will be described with reference to FIGS. 1A and 1B. FIG. 1A is a plan view illustrating an example of the OLED display device which is manufactured by the embodiment of the present invention. FIG. 1B is a view illustrating a cross-section taken along a cutting plane line IB-IB in FIG. 1A.

The OLED display device 10a illustrated in FIGS. 1A and 1B includes a first substrate 11 and a second substrate 12. The first substrate 11 in FIGS. 1A and 1B includes a TFT substrate and an organic EL element layer which is included on the TFT substrate. In the TFT substrate, pixels which have thin film transistors (TFT) are disposed in a matrix on an insulating substrate. The first substrate 11 may be configured by a glass substrate.

A portion of the first substrate 11 which constitutes the OLED display device 10a may be exposed from the second substrate 12 in a plan view. This portion of the first substrate 11 may be a terminal portion 11a illustrated in FIG. 1A.

The second substrate 12 is included so as to face the first substrate 11 and may be a color filter (CF) substrate, for example. The second substrate 12 may be configured by a glass substrate.

A filler layer 14 may be included between the first substrate 11 and the second substrate 12. The filler layer 14 is formed of filler (also referred to as a filling material) for filling a gap between the first substrate 11 and the second substrate 12.

The filler forming the filler layer 14 may be photocurable resin or the like, for example. When the filler layer 14 is formed of photocurable resin, a seal portion 13 which is formed of sealant (also referred to as a dam material) may be included around the filler layer 14.

The seal portion 13 may be included so as to surround an outer edge of a display area (an area in which there are pixels effective for serving image display) 15 of the organic EL element layer which is formed in the first substrate 11. The seal portion 13 is disposed the outside of the outer edge of the display area 15 so as to prevent distortion of an image (displayed by the OLED display device 10a) occurring due to generating distribution of the refractive index due to a subtle difference in a refractive index between the sealant which forms the seal portion 13 and the filler 54.

When a liquid crystal display device is manufactured by the method of manufacturing a display device which is the embodiment of the present invention, the liquid crystal display device may be realized by substituting the filler layer 14 with a liquid crystal layer, for example.

The method of manufacturing a display device according to the embodiment of the present invention includes preparing a multilayout display panel which has a structure of a first substrate and a second substrate which are bonded to each other and is able to be cut into a plurality of products, scribing the first substrate, bending and breaking the scribed first substrate, performing thinning on the second substrate and the broken first substrate by chemical polishing, scribing the second substrate which is subjected to the chemical polishing, and bending and breaking the scribed second substrate. In performing thinning on the second substrate and the first substrate by chemical polishing, facing surfaces of adjacent portions of the first substrate which are obtained by breaking the first substrate may be etched so as to cause a gap between the facing surfaces to become larger. In the breaking the second substrate, the first substrate may be bent by bending the second substrate while contact between at least end portions of the facing surfaces on an outer surface side of the first substrate is avoided.

Figure 2:
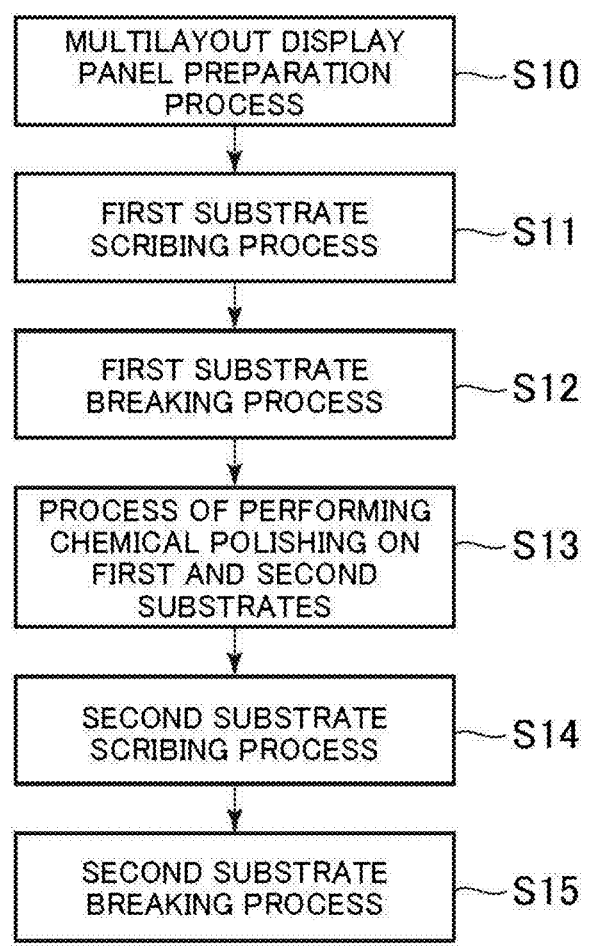
FIG. 2 is a flowchart illustrating manufacturing processes according to the embodiment of the present invention.

FIG. 2 is a flowchart illustrating manufacturing processes according to the embodiment of the present invention. The method of manufacturing a display device according to the embodiment of the present invention will be described in detail with reference to FIG. 2 for each process. Each of the processes will be described in detail with reference to FIGS. 4A to 4G which illustrate states of manufacturing the display device by using the embodiment of the present invention.

A multilayout display panel 50a which has a structure of a first substrate and a second substrate which are bonded to each other is prepared. The multilayout display panel 50a is cut into a plurality of products (OLED display device 10a in this example) (S10 in FIG. 2: multilayout display panel preparation process).

Figure 3B:
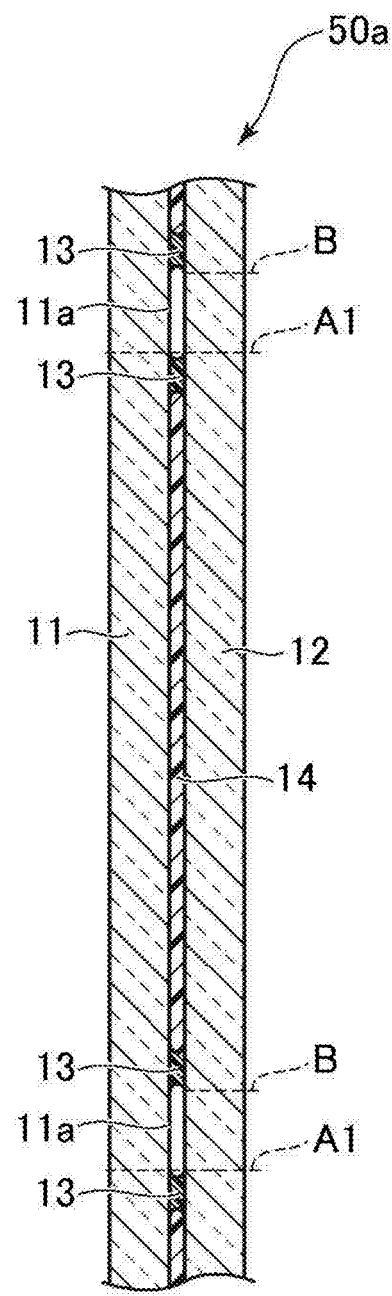
FIG. 3B is a cross-sectional view taken along a cutting plane line IIIB-IIIB in FIG. 3A.
Figure 3C:
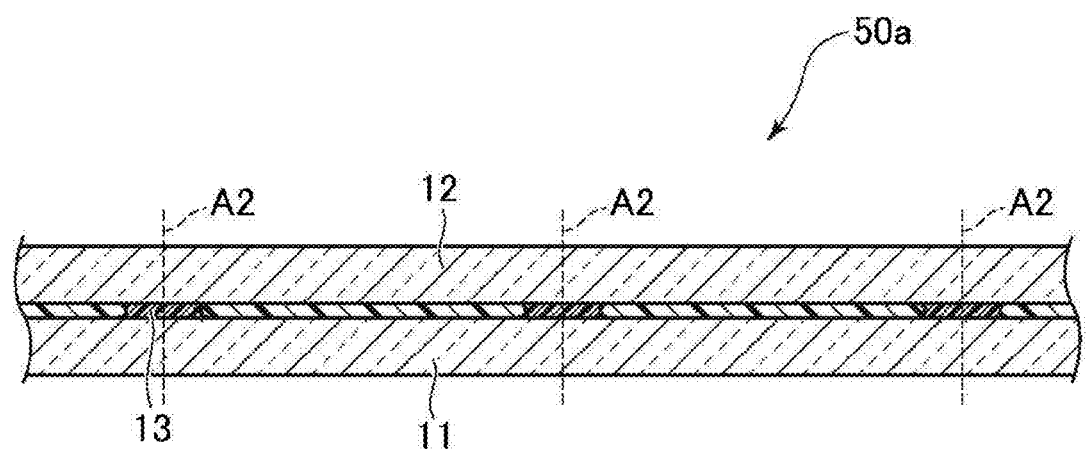
FIG. 3C is a cross-sectional view taken along a cutting plane line IIIC-IIIC in FIG. 3A.

FIG. 3A is a plan view illustrating an example of the multilayout display panel prepared in the embodiment of the present invention. FIG. 3B is a cross-sectional view taken along a cutting plane line IIIB-IIIB in FIG. 3A. FIG. 3C is a cross-sectional view taken along a cutting plane line IIIC-IIIC in FIG. 3A.

Dashed lines A1-1 to A1-6 and A2-1 to A2-7 illustrated in FIGS. 3A to 3C are scribing lines (also referred to as cutting plane lines) of the first substrate 11 and the second substrate 12 which are bonded to each other. Dashed lines B-1 to B-5 are scribing lines of the second substrate 12. The first substrate 11 and the second substrate 12 are cut at predetermined positions along the scribing lines A1-1 to A1-6, A2-1 to A2-7, and B-1 to B-5 by using a scribing and breaking method and the like. Thus, a plurality of the OLED display devices 10a illustrated in FIG. 1 are obtained.

The first substrate 11 and the second substrate 12 which constitute the multilayout display panel 50a illustrated in FIG. 3A and the like are commonly glass substrates. The multilayout display panel 50a may include the seal portion 13 between the first substrate 11 and the second substrate 12. The seal portion 13 is for sealing the plurality of products (OLED display device 10a) and is formed of sealant.

The seal portion 13 may surround a circumference of the entirety of the plurality of products in the multilayout display panel 50a. The seal portion 13 which surrounds the circumference of the entirety of the plurality of products in the multilayout display panel 50a corresponds to the seal portion 13 which is included in the vicinity of the scribing lines A1-1, A2-1, A2-7, and B-5 in FIG. 3A.

The seal portion 13 may seal each of the products (OLED display devices 10a) in the multilayout display panel 50a. When referring to FIG. 3A, one product is sealed by seal portions 13 which are included in the vicinity of the scribing lines A1-1, A2-1, A2-2, and B-1, for example.

Seal portions 13 which are interposed between the first substrate 11 and the second substrate 12 are included at positions overlapping the dashed lines A2-2 to A2-6 in a plan view. Each of the seal portions 13 which are included at positions overlapping the dashed lines A2-1 to A2-7 has a shared portion for sealing adjacent products in a state of the multilayout display panel 50a, as illustrated in FIG. 3C.

In this manner, when the seal portion 13 has the shared portion which is shared so as to seal the adjacent products, a position of the scribing line may be set to overlap the shared portion in at least one of a process (S11) of scribing the first substrate 11 and a process (S14) of scribing the second substrate 12.

Each of seal portions 13 of the multilayout display panel 50a, which is included along the dashed lines A1-1 to A1-6 and B-1 to B-5 in a plan view has a portion which is disposed with a gap for sealing the adjacent products individually.

In this manner, when the seal portion 13 has the portion which is disposed with a gap for sealing adjacent products individually, a position of the scribing line may be set to overlap an area of the gap in at least one of the process (S11) of scribing the first substrate 11 and the process (S14) of scribing the second substrate 12.

A position of a first scribing line (for example, scribing line A1 in FIG. 3A) may be set to overlap the area of the gap in the process (S11) of scribing the first substrate 11. Positions of a second scribing line (for example, scribing line A1 in FIG. 3A) and a third scribing line (for example, scribing line B in FIG. 3A) may be set to overlap the area of the gap in the process (S14) of scribing the second substrate 12 and the position of the second scribing line may be set to overlap the first scribing line.

In this manner, the scribing line in the multilayout display panel 50a may be set regardless of whether or not overlapping the seal portion 13 in a plan view.

The first substrate 11 of the multilayout display panel 50a prepared in the embodiment may have a thickness in a range of 0.5 mm or more, a range of 0.4 mm or more, or a range of 0.3 mm or more.

The upper limit of the thickness of the first substrate 11 of the multilayout display panel 50a prepared in the embodiment is not particularly defined. However, the thickness of the first substrate 11 may be 1.0 mm or less, for example.

The second substrate 12 of the multilayout display panel 50a prepared in the embodiment may have a thickness in a range of 0.5 mm or more, a range of 0.4 mm or more, or a range of 0.3 mm or more.

The upper limit of the thickness of the second substrate 12 of the multilayout display panel 50a prepared in the embodiment is not particularly defined. However, the thickness of the second substrate 12 may be 1.0 mm or less, for example.

The first substrate 11 and the second substrate 12 which constitute the multilayout display panel 50a prepared in the embodiment may be glass substrates which have not been subjected to chemical polishing. Each of the first substrate 11 and the second substrate 12 may be a glass substrate having a thickness of 0.5 mm or more.

Figure 4A:
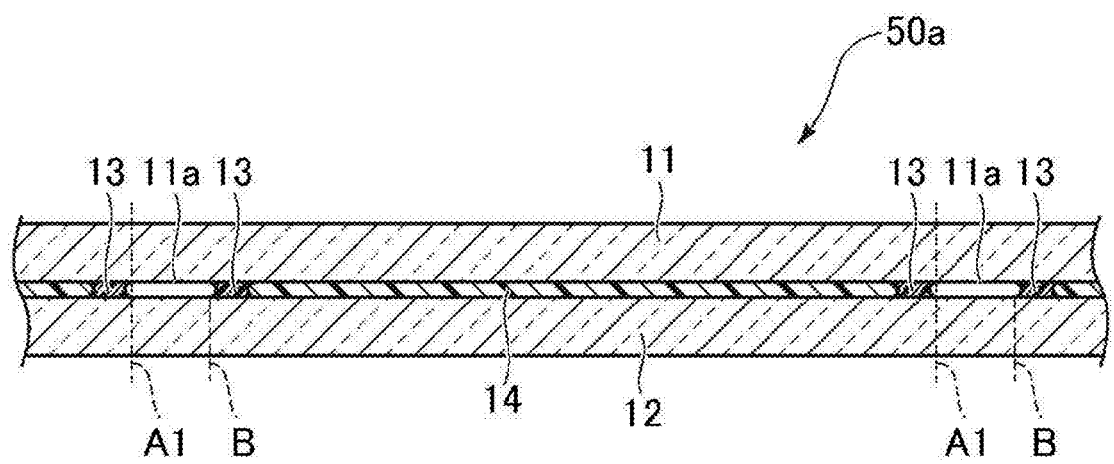
FIG. 4A is a view illustrating a state when manufacturing the display device by the embodiment of the present invention.

Next, the process (S11) of scribing the first substrate 11 and a process (S12) of bending and breaking the scribed first substrate 11 will be described. FIG. 4A illustrates a placement state of the multilayout display panel 50a prepared through the process (S10) of preparing the multilayout display panel.

Figure 4B:
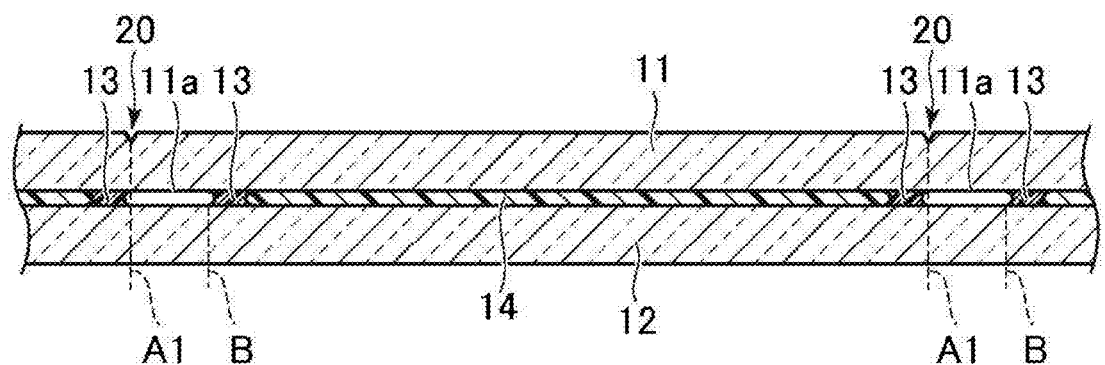
FIG. 4B is a view illustrating a state when manufacturing the display device by the embodiment of the present invention.
Figure 4C:
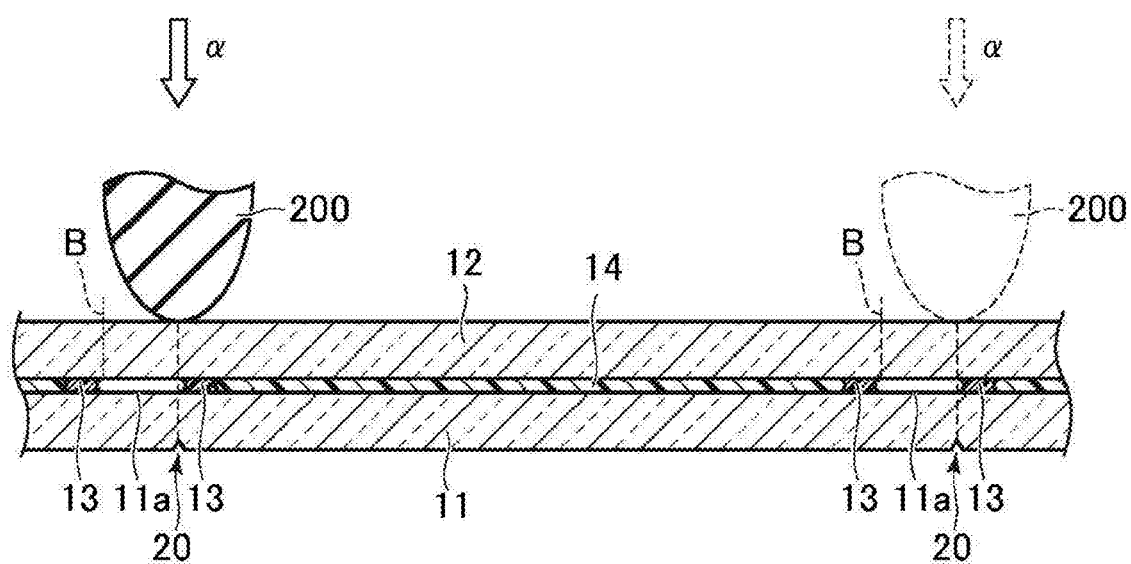
FIG. 4C is a view illustrating a state when manufacturing the display device by the embodiment of the present invention.
Figure 4D:
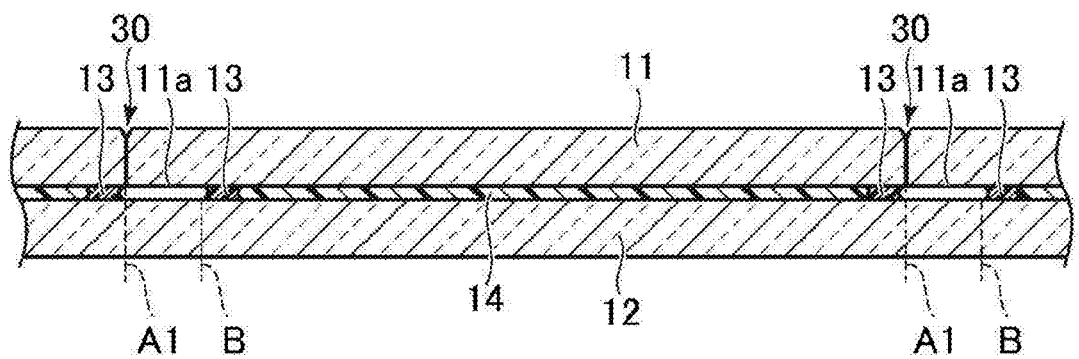
FIG. 4D is a view illustrating a state when manufacturing the display device by the embodiment of the present invention.
Figure 5A:
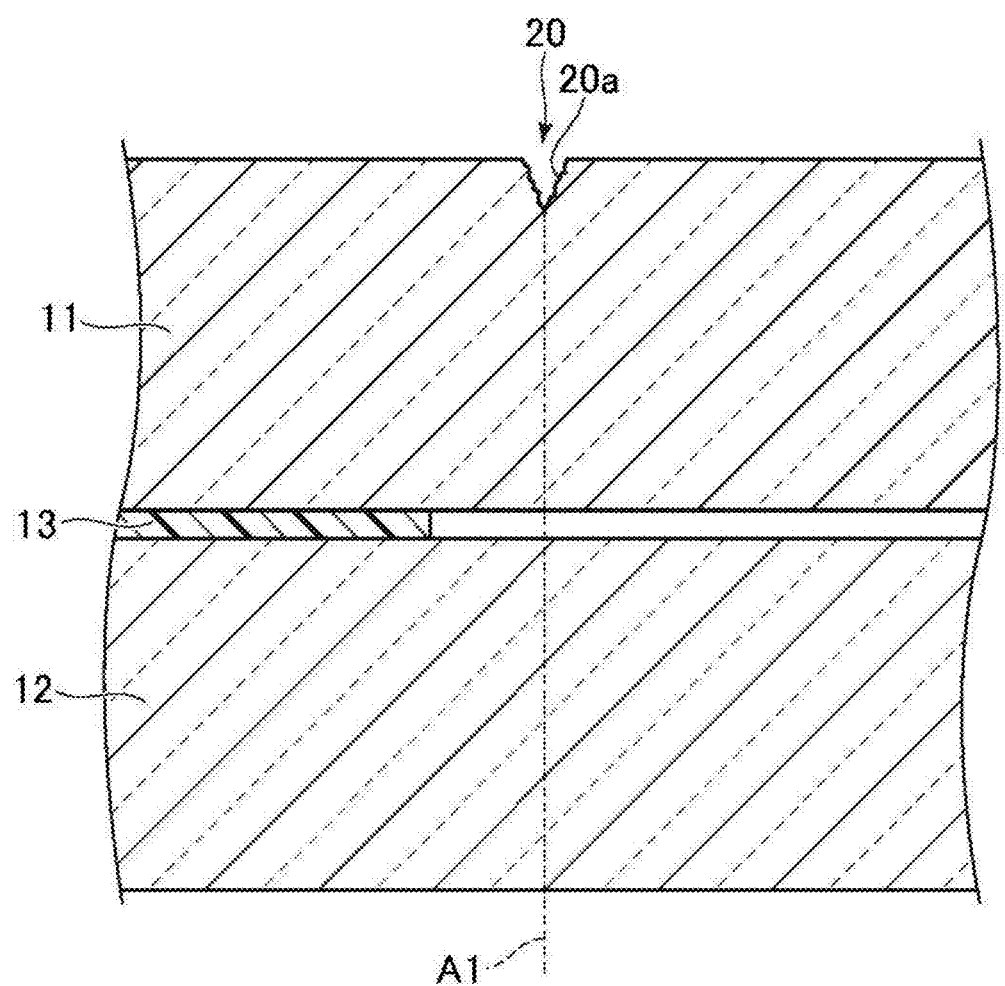
FIG. 5A is an enlarged view of a cross-section of a portion of the scribed first substrate.
Figure 5B:
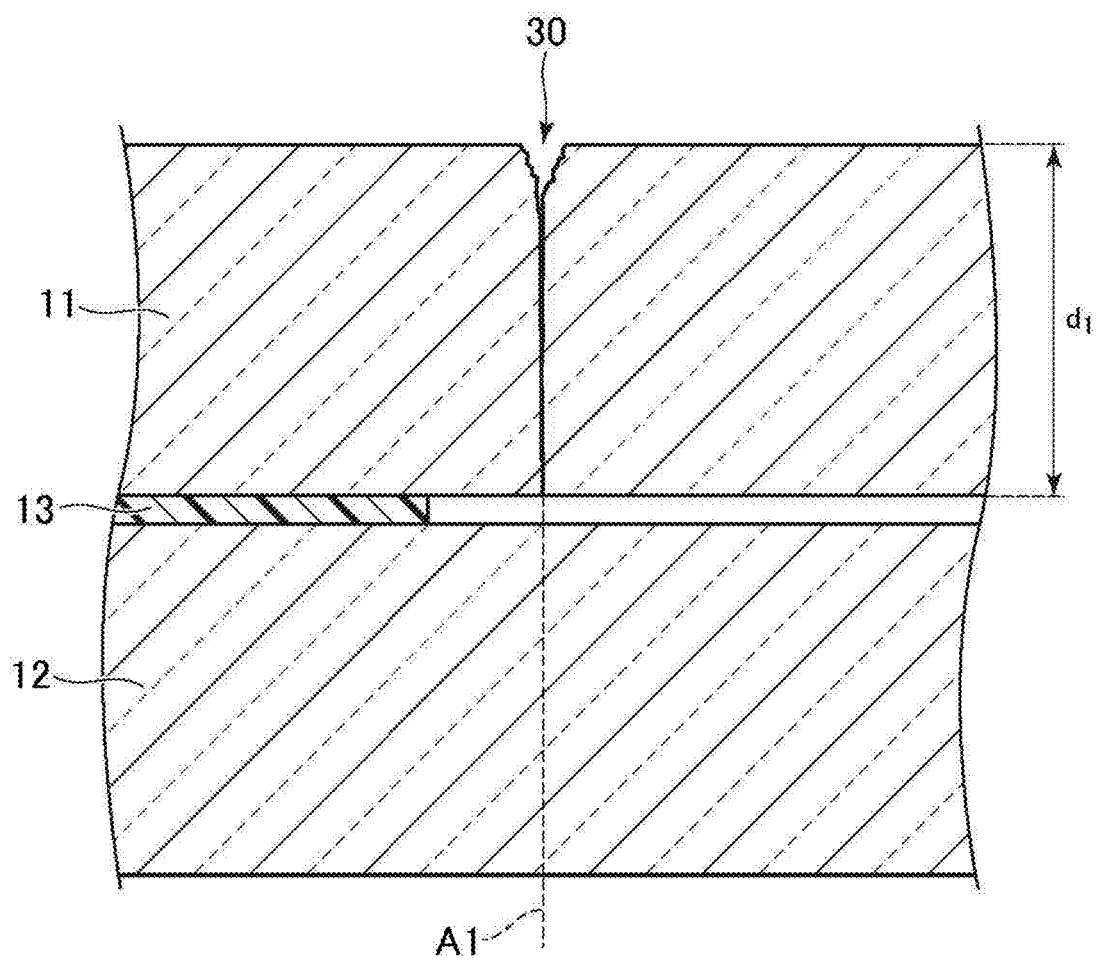
FIG. 5B is an enlarged view of a cross-section of a portion of the broken first substrate.

FIG. 4B illustrates a state where a surface of the first substrate 11 (constituting the multilayout display panel 50a) on an opposite side to a side which faces the second substrate 12 is scribed. FIG. 4C illustrates a state where the scribed first substrate 11 is bent and broken. FIG. 4D illustrates a state after the scribed first substrate 11 is broken. FIG. 5A is an enlarged view of a cross-section of a portion of the scribed first substrate 11. FIG. 5B is an enlarged view of a cross-section of a portion of the scribed first substrate 11.

In the embodiment, the first substrate 11 and the second substrate 12 constituting the multilayout display panel 50a may be glass substrates which have not been subjected to chemical polishing. Each of the first substrate 11 and the second substrate 12 may be a glass substrate having a thickness of 0.5 mm or more.

The process (S11) of scribing the first substrate 11 means a process of forming a scribing line (cutting plane line) on the first substrate 11. The scribing line may be formed by using a method of using a wheel or a method of using a laser.

The formed scribing line has a width which gradually becomes narrower in a depth direction and a cross-section of a notch in the scribing line is formed into a tapered shape.

When referring to FIG. 5A, a taper side surface 20a of a notch 20 in the scribing line which is formed on a surface of the scribed first substrate 11 is not smooth or is uneven, or this may be a potential source for generating fine cracks.

When taper side surfaces 20a facing each other are brought into contact with each other in a state where there is unevenness as described above, cracking may occur in the horizontal direction of the substrate surface in the first substrate 11. Thus, when the scribed first substrate 11 is bent and broken, bending is required such that the taper side surfaces 20a which face each other and have unevenness are not brought into contact with each other.

Accordingly, the first substrate 11 may be bent in a direction in which the notch 20 generated by performing scribing becomes wider, and thus broken in the process of breaking the scribed first substrate 11.

FIG. 4C illustrates a state where a load is applied by pressing a break rubber 200 in an α☐ direction of the second substrate 12 and thus the first substrate 11 is bent and breaks in the direction in which the width of the notch 20 generated by performing scribing becomes wider.

When referring to FIG. 5B, it can be understood that the first substrate 11 breaks substantially vertically from a tip end of the notch 20 which is generated by performing scribing. Since the width of a split 30 in the first substrate 11 is significantly small, it is possible to suppress penetration of etchant into a side of the first substrate 11 facing the second substrate 12 even though etchant is used in a later process which is a process (S13) of thinning the first substrate 11 by chemical polishing.

Figure 6:
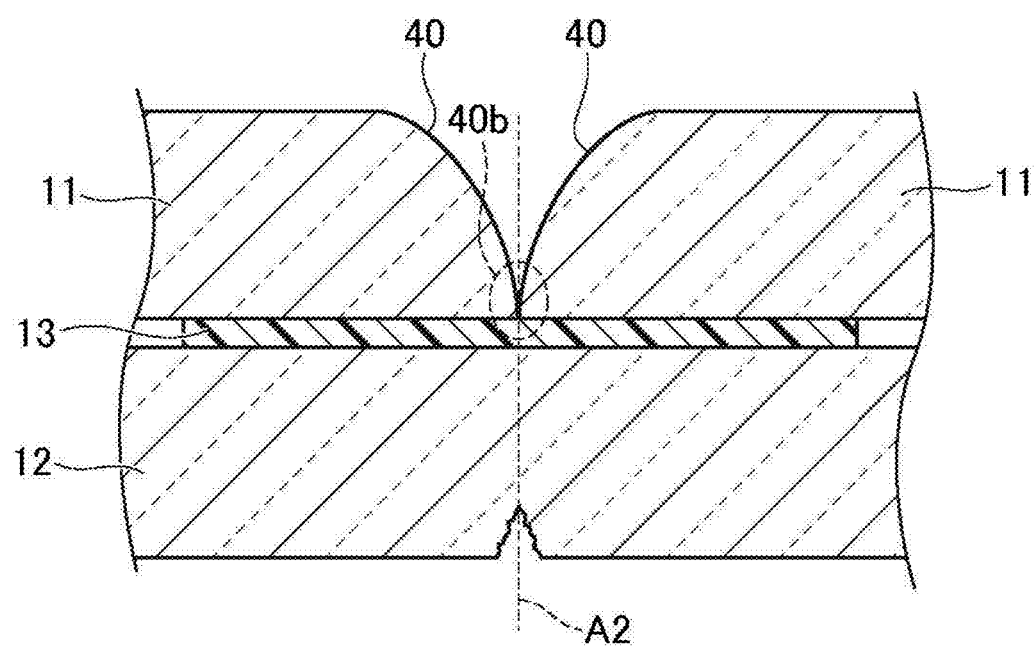
FIG. 6 is an enlarged view of a cross-section of another portion of the first substrate which is subjected to chemical polishing, and the second substrate which is subjected to chemical polishing and then is scribed.

FIG. 6 is an enlarged view of a cross-section of another portion of the first substrate 11 which is subjected to chemical polishing, and the second substrate 12 which is subjected to chemical polishing and then is scribed. FIG. 6 illustrates a state of the scribed second substrate 12 in the vicinity of a scribing line A2 after being subjected to chemical polishing.

As illustrated in FIG. 6, the seal portion 13 is provided between the first substrate 11 and the second substrate 12 in the vicinity of the scribing line A2. Thus, it is possible to suppress penetration of etchant from a slit 40b between end portions 40 of the first substrate 11 even though the etchant is used in the process (S13) of performing thinning by chemical polishing.

The depth of the notch 20 which is formed on a surface of the scribed first substrate 11 may be controlled through the process (S13) of thinning the first substrate 11 and the second substrate 12 by chemical polishing, which is a subsequent process. Preferably, the depth of the notch 20 is substantially equal to the thickness of the etched first substrate 11.

The depth of the notch 20 which is formed on the surface of the scribed first substrate 11 is controlled through the process (S13) of thinning the first substrate 11 and the second substrate 12 by chemical polishing, which is a subsequent process. If the thickness of the etched first substrate 11 is set as $T_1$, the depth of the notch 20 may be set to from $T_1 \times 0.8$ to $T_1 \times 1.0$.

In this manner, setting the depth of the notch 20 causes an extent of penetration of etchant (used in the process S13) to the side of the first substrate 11 facing the second substrate 12 to be reduced even though an opening of the notch 20 becomes wider through the process (S13) of thinning the first substrate 11 by chemical polishing, compared to a case where the depth of the notch 20 is not set.

Next, the process (S13) of thinning the broken first substrate 11 and the second substrate 12 by chemical polishing will be described. Chemical polishing in the embodiment of the present invention means a method of dipping a portion to be polished in a predefined solution (solution containing acid, alkali, a salt or the like), and dissolving the dipped portion through chemical reaction to perform polishing.

Both of the first substrate 11 and the second substrate 12 are reduced in thickness through the process (S13) of thinning the broken first substrate 11 and the second substrate 12 by chemical polishing.

For example, the process (S13) of thinning the broken first substrate 11 and the second substrate 12 by chemical polishing may be a process of etching both of the substrates up to a predefined thickness by dipping the substrates in etchant (solution containing hydrofluoric acid) and thus performing thinning on the substrates 11 and 12.

When the broken first substrate 11 is etched to perform thinning on the first substrate 11, facing surfaces of adjacent portions of the first substrate 11 which are obtained by breaking the first substrate are also simultaneously etched. Thus, the unevenness on the taper side surface 20a, which is generated by the process of performing scribing is reduced and a gap between the taper side surfaces 20a becomes wider.

That is, the width of the split 30 of the first substrate 11 becomes wider by performing etching. The unevenness on the surface, which is in each of the facing surfaces of the adjacent portions of the first substrate 11 which are obtained by breaking the first substrate 11 before etching is reduced and thus the facing surfaces become smooth.

Figure 5C:
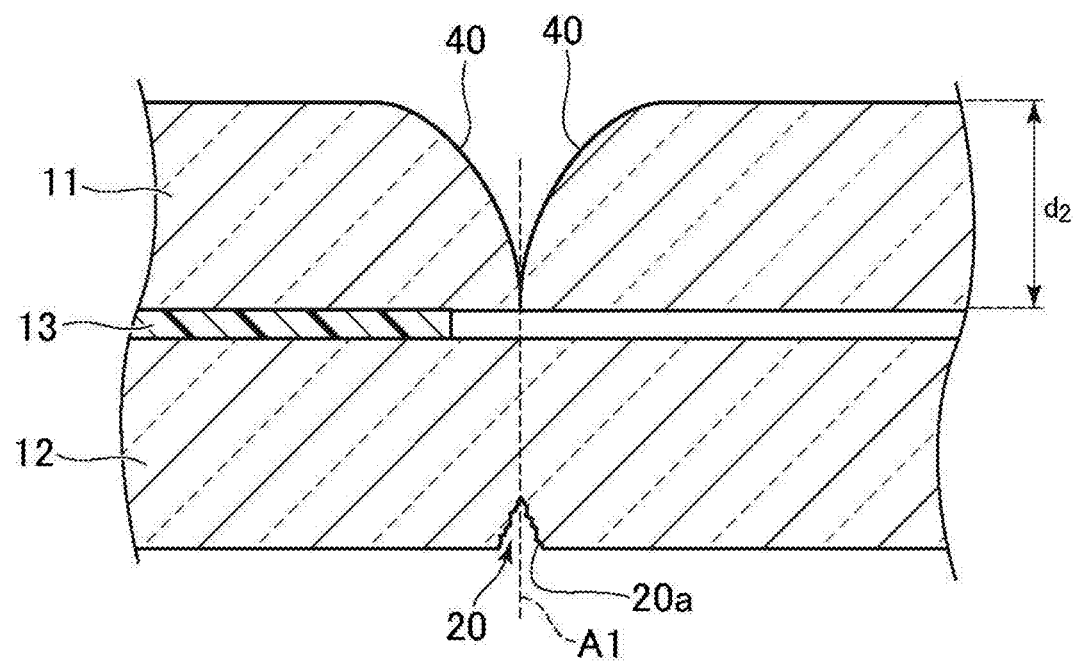
FIG. 5C is an enlarged view of a cross-section of a portion of the first substrate which is subjected to chemical polishing, and the second substrate which is subjected to chemical polishing and then is scribed.

Next, the process (S14) of scribing the second substrate 12 which is subjected to chemical polishing will be described. FIG. 5C is an enlarged view of a cross-section of a portion of the first substrate 11 which is subjected to chemical polishing and the second substrate 12 which is subjected to chemical polishing and then is scribed.

As illustrated in FIG. 5C, the thickness $d_2$ of the first substrate 11 which is subjected to the chemical polishing is smaller than the thickness $d_1$ (see FIG. 5B) of the first substrate 11 before the first substrate 11 is subjected to chemical polishing. Similarly, the thickness of the second substrate 12 which is subjected to chemical polishing is smaller than the thickness of the second substrate 12 before the second substrate 12 is subjected to chemical polishing.

The thickness $d_2$ of the first substrate 11 which is subjected to chemical polishing may be less than 0.5 mm, 0.3 mm, or 0.2 mm, for example.

The lower limit of the thickness $d_2$ of the first substrate 11 which is subjected to chemical polishing is not particularly defined. However, in view of maintenance of the strength, the thickness $d_2$ of the first substrate 11 may be equal to or more than 0.05 mm or equal to or more than 0.1 mm, for example.

Similarly, the thickness of the second substrate 12 which is subjected to chemical polishing may be less than 0.5 mm, 0.3 mm, or 0.2 mm, for example.

The lower limit of the thickness of the second substrate 12 which is subjected to chemical polishing is not particularly defined. However, in view of maintenance of the strength, the thickness of the second substrate 12 may be equal to or more than 0.05 mm or equal to or more than 0.1 mm, for example.

After chemical polishing, a surface of the second substrate 12 on an opposite side to a side facing the first substrate 11 is scribed. The second substrate 12 may be scribed by using a similar method to the method of scribing the first substrate 11, for example.

Figure 4E:
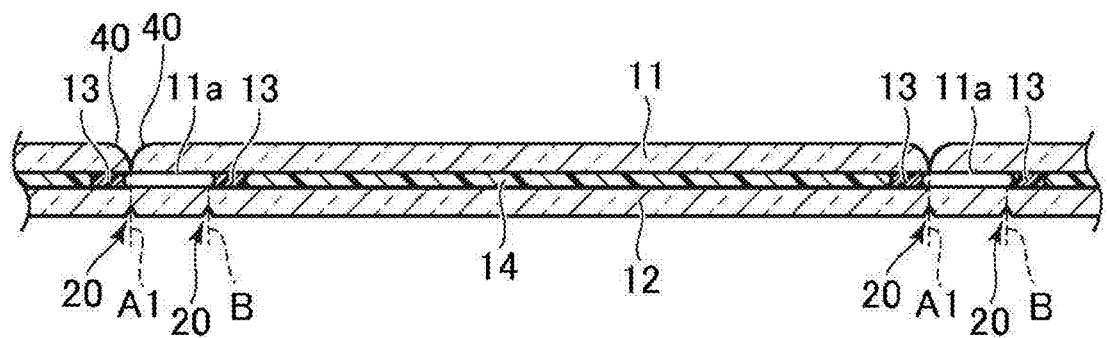
FIG. 4E is a view illustrating a state when manufacturing the display device by the embodiment of the present invention.
Figure 4F:
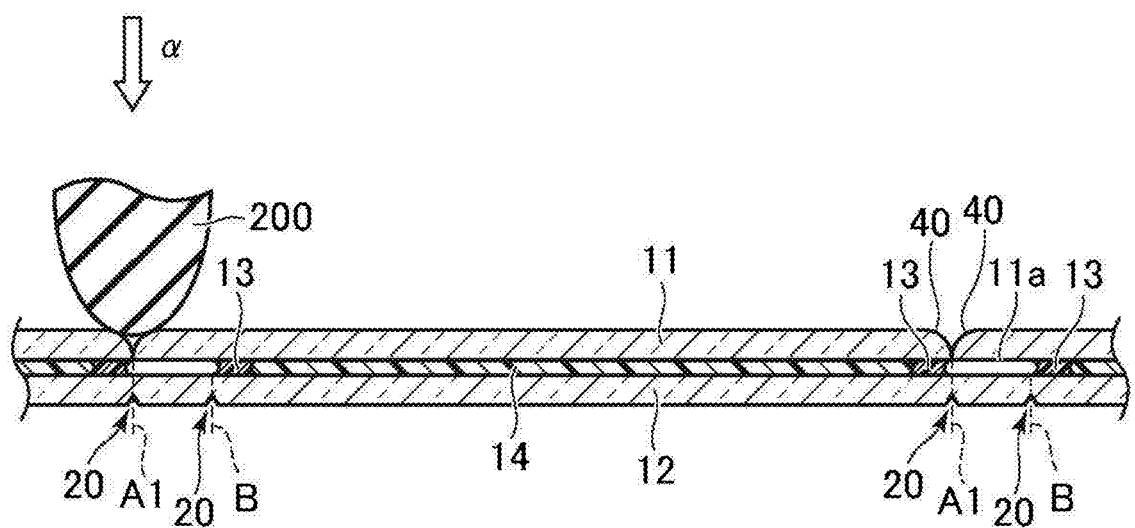
FIG. 4F is a view illustrating a state when manufacturing the display device by the embodiment of the present invention.
Figure 4G:
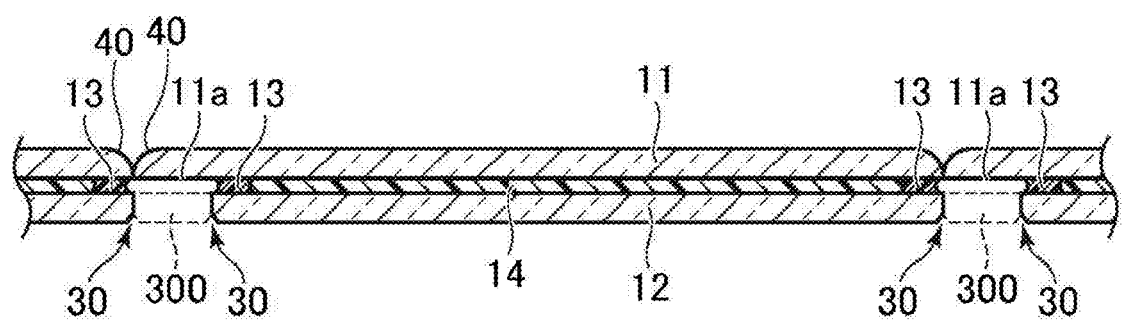
FIG. 4G is a view illustrating a state when manufacturing the display device by the embodiment of the present invention.
Figure 5D:
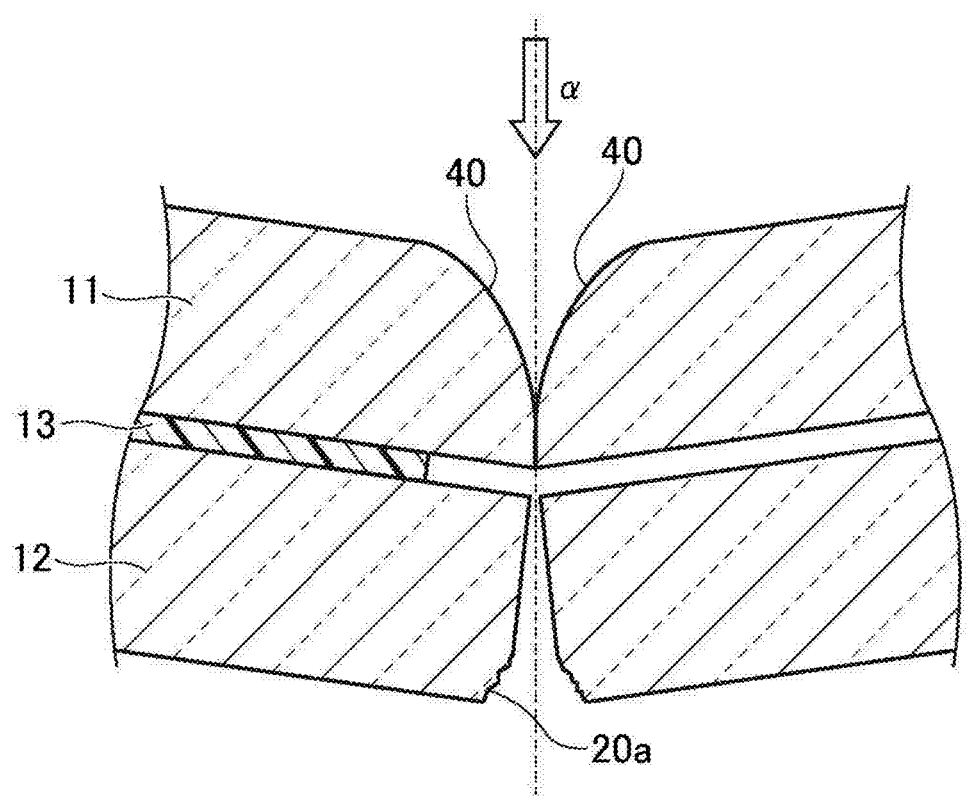
FIG. 5D is an enlarged view of a state in which the scribed second substrate is bent and broken.

Next, a process (S15) of bending and breaking the scribed second substrate 12 will be described. FIG. 4F illustrates a state where the scribed second substrate 12 is bent and broken. FIG. 4E illustrates a state after the second substrate 12 is broken. FIG. 5D is an enlarged view of a cross-section of a portion in a state where the scribed second substrate 12 is bent and broken.

When referring FIGS. 5C and 5D, taper side surfaces 20a of a notch 20 in a scribing line which is formed on a surface of the scribed second substrate 12 is not smooth or is uneven, or this may be a potential source for generating fine cracks. When such the taper side surfaces 20a which face each other and have unevenness are brought into contact with each other by bending the second substrate 12, cracking may occur in the horizontal direction of a substrate surface in the second substrate 12.

Accordingly, the second substrate 12 may be bent in a direction in which the notch 20 generated by performing scribing becomes wider, and thus broken in the process of breaking the scribed second substrate 12.

FIG. 4F illustrates a state where a load is added by pressing a break rubber 200 in an α direction of the second substrate 12 and thus the second substrate 12 is bent and broken in the direction in which the notch 20 generated by performing scribing becomes wider.

When referring to FIG. 5D, it can be understood that the first substrate 11 may be bent by bending the second substrate 12 in the process (S15) of breaking the second substrate 12 while contact between at least end portions 40 on an outer surface side of the first substrate 11 in the facing surfaces of the adjacent portions of the first substrate 11 which are obtained by breaking the first substrate 11 is avoided.

Since the first substrate 11 is broken and then etched and thus a gap between the facing surfaces of the adjacent portions obtained by performing breaking becomes wider, interference between the end portions 40 on the outer surface side of the first substrate 11 is suppressed in the process (S15) of breaking the second substrate 12. As a result, probability of cracking occurring in the horizontal direction of the substrate surface is reduced in the first substrate 11.

The depth of the notch 20 which is formed on the surface of the scribed second substrate 12 is not particularly limited. However, for example, if the thickness of the etched second substrate 12 is set as $T_2$, the depth of the notch 20 may be $T_2 \times 0.001$ or more and less than $T_2 \times 0.5$. Alternatively, the depth of the notch 20 may be $T_2 \times 0.001$ or more and less than $T_2 \times 0.3$.

It is possible to reliably perform the process (S15) of performing breaking without damage to the second substrate 12 having physical strength which is degraded by performing etching and thinning on the second substrate 12, by setting the depth of the notch 20 which is formed on the surface of the scribed second substrate 12 to be the depth as described above.

After the process (S15) of breaking the second substrate 12, an unnecessary substrate piece 300 between the scribing line A1 and the scribing line B is removed in the second substrate 12 and thus a plurality of products (OLED display devices 10a in this example) are obtained from the multilayout display panel 50a.

A display device (OLED display device 10a in this example) which is manufactured through the above processes has the end portions of the first substrate 11 which have a small extent of unevenness compared to the end portions of the second substrate 12. The display device (OLED display device 10a) which is manufactured through the above processes has the end portions of the first substrate 11 which is subjected to chemical polishing and the end portions of the second substrate 12 which is not subjected to chemical polishing.

Next, a method of manufacturing a display device according to another embodiment of the present invention will be described. The method of manufacturing a display device according to another embodiment includes a different multilayout display panel prepared in the process (S10) of preparing a multilayout display panel, compared to the above-described embodiment.

The method of manufacturing a display device according to this embodiment which will be described as follows is mainly applied to an OLED display device. Descriptions will be made based on an example of applying the method of manufacturing a display device according to this embodiment to a method of manufacturing an OLED display device.

Figure 8B:
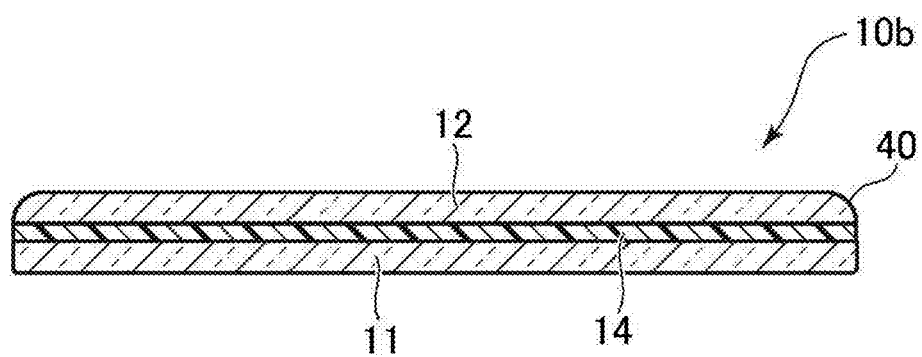
FIG. 8B is a cross-sectional view taken along a cutting plane line VIIIB-VIIIB in FIG. 8A.

FIG. 7 is a plan view illustrating an example of the multilayout display panel prepared in the other embodiment of the present invention. FIG. 8A is a plan view illustrating an example of a display device manufactured by the other embodiment of the present invention. FIG. 8B is a cross-sectional view taken along a cutting plane line VIIIB-VIIIB in FIG. 8A.

Dashed lines A1-1 to A1-6 and A2-1 to A2-7 illustrated in FIG. 7 indicate scribing lines of the first substrate 11 and the second substrate 12 which are bonded to each other. A plurality of OLED display devices 10b illustrated in FIGS. 8A and 8B are obtained by cutting the first substrate 11 and the second substrate 12 at a predetermined position along the scribing lines A1-1 to A1-6 and A2-1 to A2-7 using the scribing and breaking method and the like.

The first substrate 11 and the second substrate 12 which constitute a multilayout display panel 50b illustrated in FIG. 7 may be commonly glass substrates. The multilayout display panel 50b in this embodiment is different from that in the previously-described embodiment of the present invention in that the seal portion 13 is not included so as to surround a circumference of the entirety of the OLED display devices 10b when the first substrate 11 and the second substrate 12 are respectively cut.

That is, the OLED display devices 10b obtained from the multilayout display panel 50b which is prepared in this embodiment include an OLED display device of which an outer edge is not sealed by the seal portion 13. A filler layer 14 may be included between the first substrate 11 and the second substrate 12. The filler layer 14 is formed of filler for filling a gap between the first substrate 11 and the second substrate 12.

In this manner, the scribing lines may be set in the multilayout display panel 50b regardless of whether or not overlapping the seal portion 13 in a plan view.

The first substrate 11 of the multilayout display panel 50b prepared in this embodiment may have a thickness in a range of 0.5 mm or more, a range of 0.4 mm or more, or a range of 0.3 mm or more.

The upper limit of the thickness of the first substrate 11 of the multilayout display panel 50b prepared in this embodiment is not particularly defined. However, the thickness of the first substrate 11 may be 1.0 mm or less, for example.

The second substrate 12 of the multilayout display panel 50b prepared in this embodiment may have a thickness in a range of 0.5 mm or more, a range of 0.4 mm or more, or a range of 0.3 mm or more.

The upper limit of the thickness of the second substrate 12 of the multilayout display panel 50b prepared in this embodiment is not particularly defined. However, the thickness of the second substrate 12 may be 1.0 mm or less, for example.

The first substrate 11 and the second substrate 12 constituting the multilayout display panel 50b prepared in this embodiment may be glass substrates which have not been subjected to chemical polishing. Each of the first substrate 11 and the second substrate 12 may be a glass substrate having a thickness of 0.5 mm or more.

The OLED display device 10b manufactured by this embodiment does not include the seal portion 13 which surrounds an outer edge of the display area (an area in which there are pixels effective for serving image display) 15 of the organic EL element layer which is formed in the first substrate 11, and is included in the above-described embodiment, as illustrated in FIGS. 8A and 8B.

A display device (OLED display device 10b in this example) which is manufactured through the above processes has the end portions of the first substrate 11 which have a small extent of unevenness compared to the end portions of the second substrate 12. The display device (OLED display device 10b) which is manufactured through the above processes has the end portions of the first substrate 11 which is subjected to chemical polishing and the end portions of the second substrate 12 which is not subjected to chemical polishing.

While there have been described what are at present considered to be certain embodiments of the invention, it will be understood that various modifications may be made thereto, and it is intended that the appended claims coverall such modifications as fall within the true spirit and scope of the invention.

What is claimed is:

1. A method of manufacturing a display device comprising:
    preparing a multilayout display panel to be divided into a plurality of products, the multilayout display panel having a structure of a first substrate and a second substrate being bonded to each other;
    scribing the first substrate to form a first notch on the first substrate;
    bending and breaking the scribed first substrate at the first notch;
    performing thinning on the second substrate and the broken first substrate by chemical polishing to widen the first notch;
    scribing the second substrate that has been subjected to the chemical polishing to form a second notch on the second substrate; and
    bending the scribed second substrate and the scribed first substrate that has been subjected to the chemical polishing to break the scribed second substrate, wherein the scribed second substrate and the scribed first substrate are bent in a direction in which the second notch becomes wider and the widened first notch becomes narrower.

2. The method of manufacturing a display device according to claim 1, wherein
    the first substrate and the second substrate are glass substrates.

3. The method of manufacturing a display device according to claim 1, wherein
    the multilayout display panel has a seal portion between the first substrate and the second substrate, which is formed of sealant and is for sealing the plurality of products.

4. The method of manufacturing a display device according to claim 3, wherein
    the seal portion surrounds a circumference of the entirety of the plurality of products.

5. The method of manufacturing a display device according to claim 3, wherein
    the seal portion seals each of the products.

6. The method of manufacturing a display device according to claim 5, wherein
    the seal portion has a shared portion which is shared so as to seal products which are adjacent to each other.

7. The method of manufacturing a display device according to claim 5, wherein
    the seal portion has portions which are disposed with a gap for sealing the adjacent products individually.

8. The method of manufacturing a display device according to claim 6, wherein
    a position of a scribing line is set to overlap the shared portion in at least one of the scribing of the first substrate and the scribing of the second substrate.

9. The method of manufacturing a display device according to claim 7, wherein
    a position of a scribing line is set to overlap an area corresponding to the gap in at least one of the scribing of the first substrate and the scribing of the second substrate.

10. The method of manufacturing a display device according to claim 7, wherein
    a first scribing line has a position which is set to overlap the area corresponding to the gap in the scribing of the first substrate,
    a second scribing line and a third scribing line have positions which are set to overlap the area corresponding to the gap in the scribing of the second substrate, and
    the position of the second scribing line overlaps the first scribing line.

* * * * *